(12) United States Patent
Yang

(10) Patent No.: US 7,355,275 B2
(45) Date of Patent: Apr. 8, 2008

(54) CHIP PACKAGE AND FABRICATING METHOD THEREOF

(75) Inventor: Chih-An Yang, Shindian (TW)

(73) Assignee: VIA Technologies, Inc., Taipei (TW)

( * ) Notice: Subject to any disclaimer, the term of this patent is extended or adjusted under 35 U.S.C. 154(b) by 54 days.

(21) Appl. No.: 11/230,452

(22) Filed: Sep. 21, 2005

(65) Prior Publication Data
US 2006/0202329 A1   Sep. 14, 2006

(30) Foreign Application Priority Data
Mar. 11, 2005   (TW) ............................... 94107441 A

(51) Int. Cl.
*H01L 23/22* (2006.01)
*H01L 23/24* (2006.01)

(52) U.S. Cl. ...................... 257/687; 257/701; 438/122

(58) Field of Classification Search ........ 257/687–690, 257/734, 737, 738, 787, 796; 438/112, 127
See application file for complete search history.

(56) References Cited

U.S. PATENT DOCUMENTS 6,844,622 B2   1/2005   Huang et al.

2003/0170450 A1 *   9/2003   Stewart et al. ............... 428/343
2003/0178721 A1 *   9/2003   Lo et al. ...................... 257/723

FOREIGN PATENT DOCUMENTS

TW   574750   2/2004
TW   580742   3/2004

OTHER PUBLICATIONS

IBM Technical Disclosure Bulletin "Multilevel Metallized Semiconductor chip Edge", (Published Apr. 1988 vol. 30 issue 11 pp. 455-457).*

* cited by examiner

*Primary Examiner*—Jerome Jackson
*Assistant Examiner*—Jami M Valentine
(74) *Attorney, Agent, or Firm*—Birch, Stewart, Kolasch & Birch, LLP

(57) ABSTRACT

A chip package and fabricating method thereof are provided to maintain the thermal dissipating efficiency and reduce the damage to the chip. The edge of the exposed portion would be cracked caused by external force because of the substrate of the chip is brittle. The crack in the edge of the chip will degrade the reliability and induce the malfunction of the chip. In this case, the chip is disposed at least one elastic element at the edges of the exposed side to reduce the risk of the crack in the chip.

20 Claims, 7 Drawing Sheets

CHIP PACKAGE AND FABRICATING METHOD THEREOF

BACKGROUND OF THE INVENTION

1. Field of Invention

The present invention relates to a chip package and fabricating method thereof, and more particularly, to a chip package and fabricating method thereof with at least one elastic element.

2. Brief Discussion of the Related Art

Accompanying to the development of semiconductor device and process, the chips trends to high density and small wire width. More and more functionalities are integrated within the same scale size. That is, more signal terminals are needed for the chip to connect with outside and more heat dissipated from the same area. In order to satisfy these requirements, a chip package also trends to a flip-chip technology.

FIG. 1 shows a lateral view of a conventional flip-chip package. The package at least includes a chip 10 and a chip carrier 20. The chip 10 has a first surface 11 and a plurality of pads 13 disposed on the first surface 11. The first surface 11 is located at one side of the chip 10 and so-called an active surface. A bump 30 is disposed on each pad 13 of the chip 10, which is made of metal or alloy such as lead-tin alloy. The bumps 30 are then soldered with the chip carrier 20, the pads 13 are electrically connected with the chip carrier 20, and the signals from the chip 10 are transmitted to the chip carrier 20 through the bumps 30. Then the chip 10 is connected to a circuit board (not shown) by the internal circuit and a plurality of solder balls 21 of the chip carrier 20. The active surface 11 of the chip 10 faces to the chip carrier 20 and the bonding is so-called flip-chip package technology. In order to protect and enhance the connection between the chip 10, the bumps 30 and the chip carrier 20, the package further has an insulating material 40 disposed between the chip 10 and the chip carrier 20. The insulating material 40 surrounds the bumps 30 and covers a portion of the chip 10. The chip has a second surface 12, so-called a back surface, located at the other side of the chip 10. The second surface 12 is thus not covered by the insulating material 40.

Due to the substrate of the chip 10 is made of silicon and the material property is brittle and cannot sustain the collisions, the chip 10 is supported and protected by the chip carrier 20 and then to be packaged. However, the package by flip-chip bonding cannot protect the chip 10 well because the second surface 12 of the chip 10 is exposed outside. The chip 10 may be damaged in the following processes and operations especially the cracks in the edge of the second surface 12 caused by the collisions. The edge of the chip is possible to be cracked by the collisions during wafer cutting, testing, packaging, manufacture and shipment of end product. The cracks in the edge of the chip will degrade the reliability and induce the malfunction of the chip. Such an insufficient protection to the chip will raise the damage possibility and cause the return ratio and cost increasing.

FIG. 2 shows a prior art to avoid the edge of the second surface of the chip from damage. The package includes a chip 10, a chip carrier 20, a plurality of bumps 30 electrically connected with the chip 10 and the chip carrier 20, an insulating material 40 surrounded the bumps 30 and covered a portion of the chip 10, and a reinforced dam 50 surrounded the edge of the chip 10. The reinforced dam 50 is fixed on the chip carrier 20 and located at the same side with the chip 10. The edge of the chip 10 can avoid the lateral collisions to the chip 10 by the reinforced dam 50. However, the reinforced dam 50 disposed on the chip carrier 20 will occupy the space of the chip carrier 20 and the scale size of the chip carrier 20 is limited and cannot be shrunk down. In addition, if the height of the reinforced dam 50 is higher than that of the chip 10, the heat dissipated from the chip 10 will be blocked from dissipating to lateral direction and lower thermal dissipating efficiency caused by the heatsink (not shown) on the second surface 12 of the chip 10 is not effectively contacted with the chip 10. The whole thermal dissipating efficiency of the chip 10 is thus reduced. If the height of the reinforced dam 50 is lower than that of the chip 10, the edge of the chip 10 is not well-protected and the damage to the edge of the chip 10 cannot be effectively reduced.

It is therefore an important subject of the present invention to provide a chip package and fabricating method thereof to simultaneously achieve well protection and thermal dissipation to the chip.

SUMMARY OF THE INVENTION

In view of the foregoing, the present invention is to provide a chip, a chip package and fabricating method thereof with at least one elastic element.

To achieve the above, a chip according to the present invention includes a first surface, a second surface, a plurality of pads disposed on the first surface, and at least one elastic element disposed in the trench of the edge of the second surface. The first surface and the pads are located at one side of the chip, the second surface and the elastic element are located at the other side of the chip, wherein the first surface is an active surface, and the second surface is a non-active surface.

The chip with elastic element is further connected with a chip carrier by packaging technology to form a chip package. The packaging technology may be a flip-chip packaging or a wire bonding. The second surface of the chip and the elastic element are exposed outside after packaging, the chip has excellent thermal dissipating efficiency and reduce the damage possibility to the edge of the chip by the elastic element.

To achieve the above, a fabricating method of the chip and the chip package according to the present invention includes the steps of: providing a wafer having a plurality of chips, the chip includes a first surface, a second surface and a plurality of pads disposed on the first surface; trenching the edge of the second surface of the chip to form at least one trench; dispensing an elastic material into the trench to form at least one elastic element; cutting the wafer to separate the chips; and packaging the chip to form a chip package to expose the second surface and the elastic element.

As mentioned above, by disposing at least on elastic element on the edge of the chip, a chip, a chip package and fabricating method thereof according to the present invention may reduce the damage possibility to the chip caused by the collisions and maintain the thermal dissipating efficiency.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
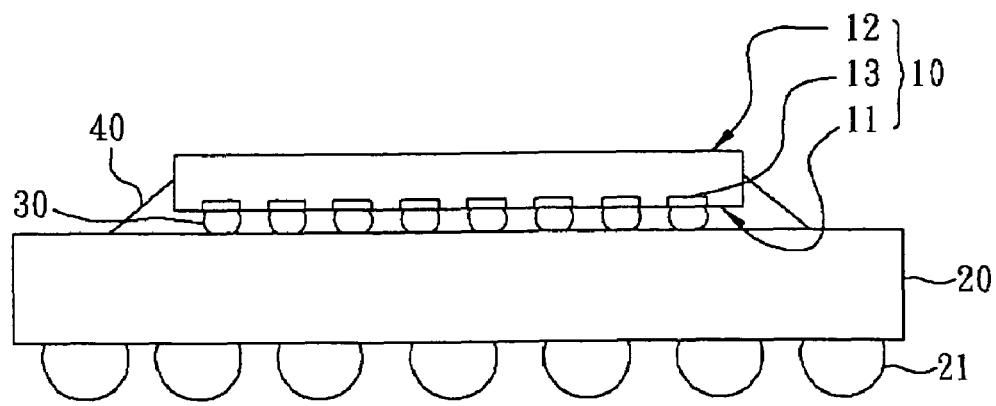
FIG. 1 is a schematic view showing a continental flip-chip package.
Figure 2:
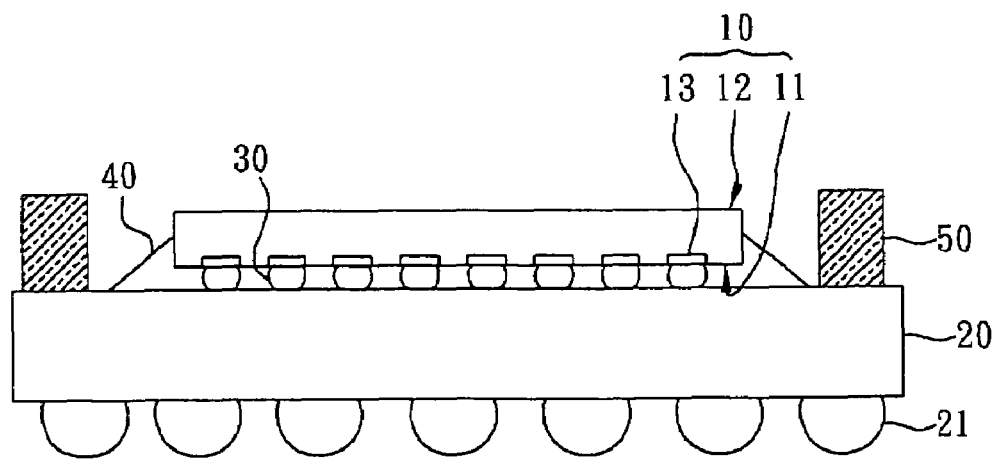
FIG. 2 is a schematic view showing a conventional flip-chip package with a reinforced dam.
Figure 3:
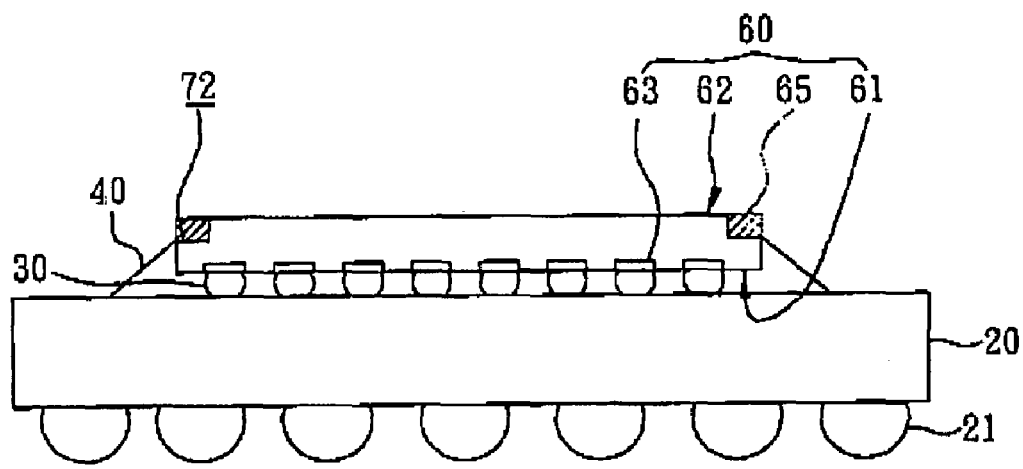
FIG. 3 is a schematic view showing a flip-chip package according to the present invention.

FIG. 3 shows a flip-chip package according to the present invention. A chip 60 with elastic element is made by a substrate such as silicon. The chip 60 includes a first surface 61 located at one side of the chip 60, a second surface 62 located at the other side of the chip 60, a plurality of pads 63 disposed on the first surface 61, and at least one elastic element 65 disposed on the edge of the second surface 62. The second surface 62 has at least one trench 72, in which the elastic element 65 is disposed. The first surface 61 is so-called an active surface and the second surface 62 is so-called a back surface. The pads 63 are electrically connected with the signals from the chip 60 and the outside. The elastic element 65 is made of photosensitive material, for example benzo-cyclobutene (BCB) or polyimide, disposed on the edge of the second surface 62 of the chip 60 to absorb the collisions and reduce the cracks caused by the collisions. In this embodiment, the elastic element 65 is in ring-shaped surrounded the edge of the second surface 62. The elastic element 65 is not protruded over the second surface 62 of the chip 60. A thermal dissipating element such as heatsink may be disposed on the second surface 62 in the following process according to practical requirement to enhance the thermal dissipating efficiency of the chip 60.

The chip 60 with elastic element may be flip-chip packaged to be a chip package. A bump 30 is disposed on each pad 63 of the chip 60, which is made of metal or alloy such as lead-tin alloy or copper. The bumps 30 are then soldered with the chip carrier 20 to electrically connect to the chip 60 and the chips carrier 20, respectively. An insulating material 40, which is an insulating material, is disposed between the chip 60 and the chip carrier 20 to surround the bumps 30 and cover a portion of the chip 60. The flip-chip package is then formed. The packaging processes are packaged the chip 60 on the chip carrier 20, the second surface 62 of the chip 60 and the elastic element 65 are exposed out of the package. The package is thus exposed the chip 60 to maintain the thermal dissipating efficiency and the elastic element 65 disposed on the exposed edge of the second surface 62 may protect the chip 60. In addition, the chip carrier 20 has a plurality of solder balls 21 to electrically connect the package to a circuit board (not shown).

Figure 4:
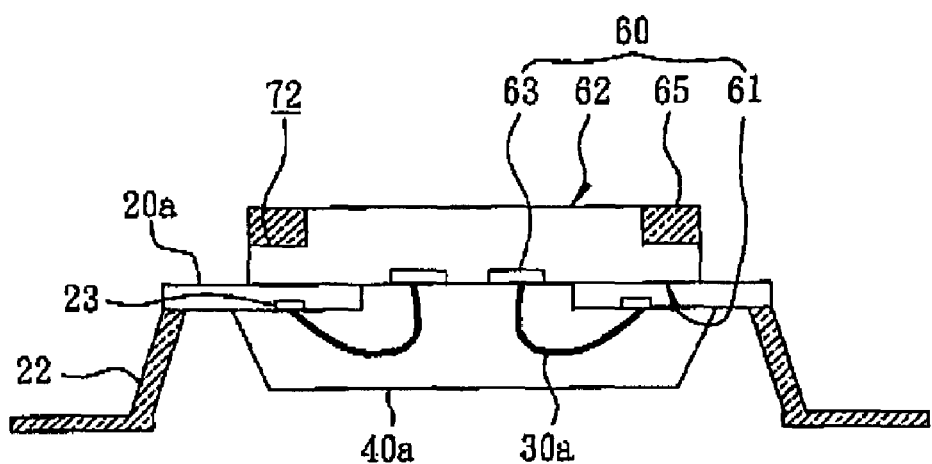
FIG. 4 is a schematic view showing a wire-bonding package according to the present invention.

Although the chip and the chip package are illustrated in flip-chip technology herein above, however they are not limitative to flip-chip technology only. FIG. 4 shows a wire-bonding package according to the present invention. The package includes a chip 60, a lead frame 20a, a plurality of bonding wires 30a and an encapsulating material 40a. As shown in FIG. 3, the chip 60 with elastic element includes a plurality of pads 63 disposed on the first surface 61 and at least one elastic element 65 in ring-shaped disposed on the edge of the second surface 62. The pads 63 and the first surface 61 are located at one side of the chip 60, the second surface 62 and the elastic element 65 are located at the other side of the chip 60. In FIG. 4, the lead frame 20a has a plurality of leads 22 and a plurality of bonding pads 23 respectively connected to a circuit board (not shown) and the chip 60. After the chip 60 is fixed on the lead frame 20a, the bonding wire 30a is connected between the pad 63 of the chip 60 and the bonding pad 23 of the lead frame 20a. The bonding wire 30a is made of metal or alloy such as gold. The encapsulating material 40a, which is also an insulating material, is then covered and protected the bonding wires 30a, the pads 63 and the bonding pads 23. In this embodiment, the second surface 62 of the chip 60 and the elastic element 65 are also exposed out of the encapsulating material 40a to maintain the thermal dissipating efficiency of the chip 60 and the elastic element 65 disposed on the exposed edge of the second surface 62 may protect the chip 60. In addition, a thermal dissipating element such as heatsink may be disposed on the second surface 62 to enhance the thermal dissipating efficiency of the chip 60.

Although the elastic element 65 disposed on the edge of the chip 60 and the chip package are illustrated in ring-shaped surrounding the second surface 62 of the chip 60, however it is not limitative to ring-shaped only. If the chip 60 is rectangular, four elastic elements are respectively disposed on the four corners of the second surface 62 to reduce possible cracks at the corners. Alternatively, a plurality of elastic strips are disposed on the edge of the second surface 62 to protect the edge of the chip 60.

Figure 5A:
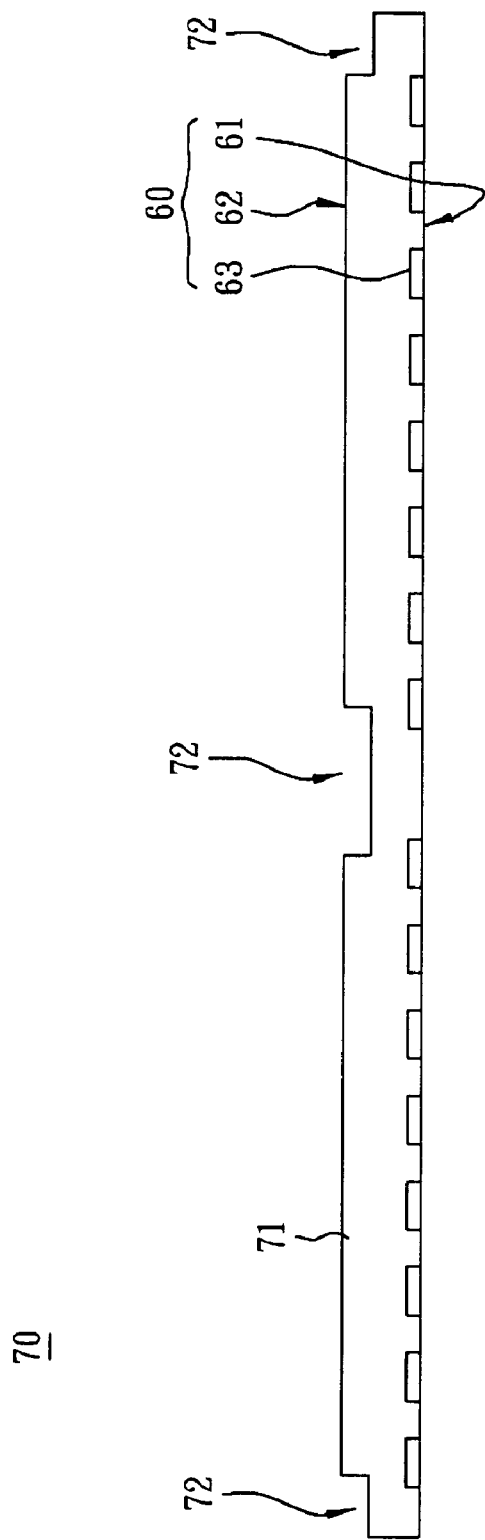
FIGS. 5a to 5e are schematic views showing a fabricating method of the flip-chip package according to the present invention.

FIGS. 5a to 5e show a fabricating method of the flip-chip package according to the present invention. As shown in FIG. 5a, providing a wafer 70, made by a substrate 71 such as silicon, having a plurality of chips 60, the chip at least includes a first surface 61, a second surface 62 and a plurality of pads 63 disposed on the first surface 61. A plurality of trenches 72 are formed by trenching the edge of the second surface 62 of each chip 60. The trenches 72 may be formed by dispensing a photoresist layer on the whole second surface and then forming at least one trench 72 by photolithography or by physical method to surround the edge of the second surface 62 or form at least one trench 72 at the edge of the second surface 62.

Figure 5B:
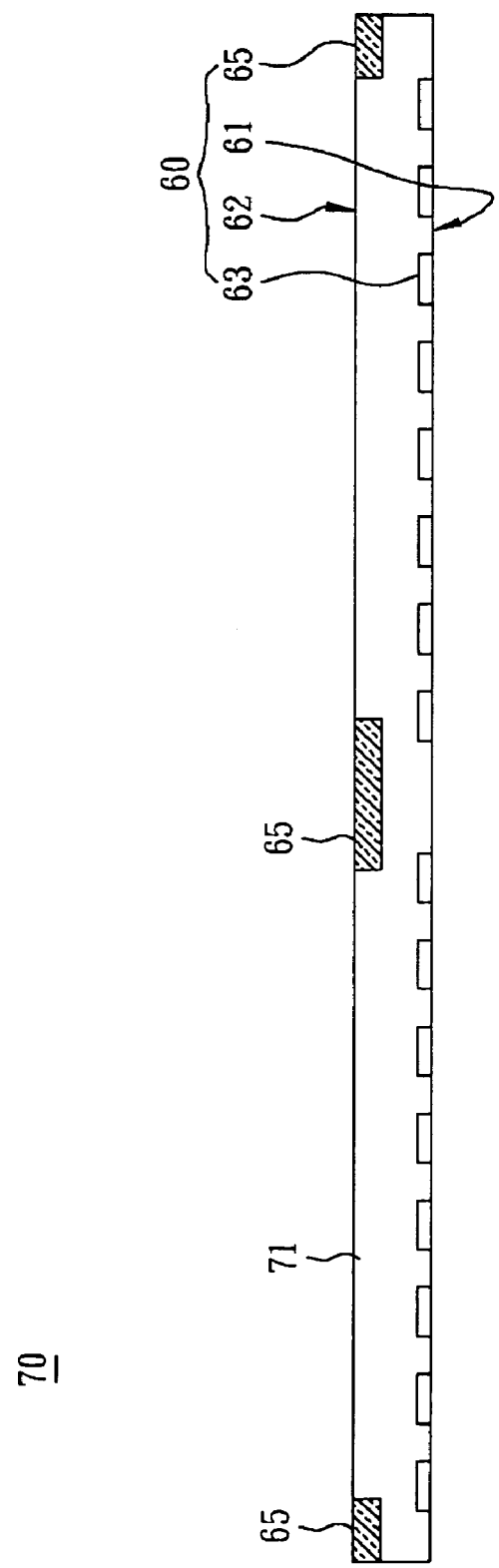
Figure 5C:
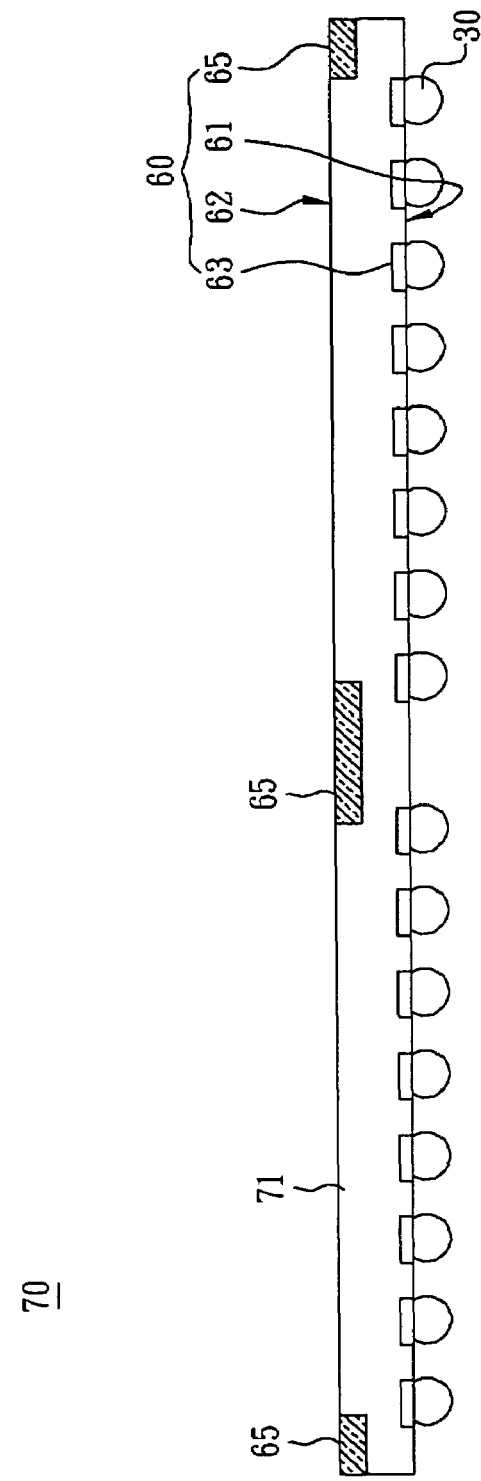

As shown in FIG. 5b, dispensing an elastic material into the trench 72 to form the elastic element 65. The elastic material is a photosensitive material, for example benzo-cyclobutene (BCB) or polyimide. The elastic material may be just dispensed into the trench 72 by coating or be generally dispensed on the whole second surfaces 62 of the wafer 70 and then be removed outside the trenches 72 by photolithography. This step may further include a planarization process to keep the elastic element 65 being not protruded over the second surface 62 of the chip 60. As shown in FIG. 5c, a bump 30 is disposed on each pad 63 of the chip 60 or the bumps 30 are respectively disposed on one of the pads. If the chip is bonded by other bonding methods such as wire-bonding, this step is unnecessary.

Figure 5D:
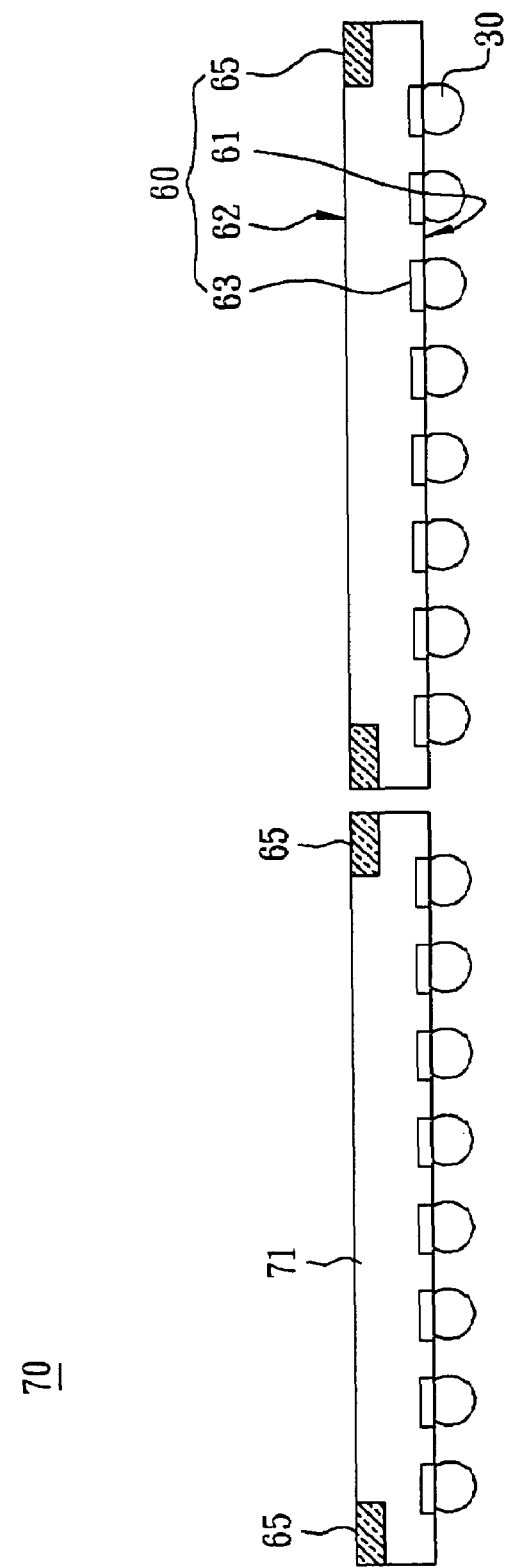
Figure 5E:
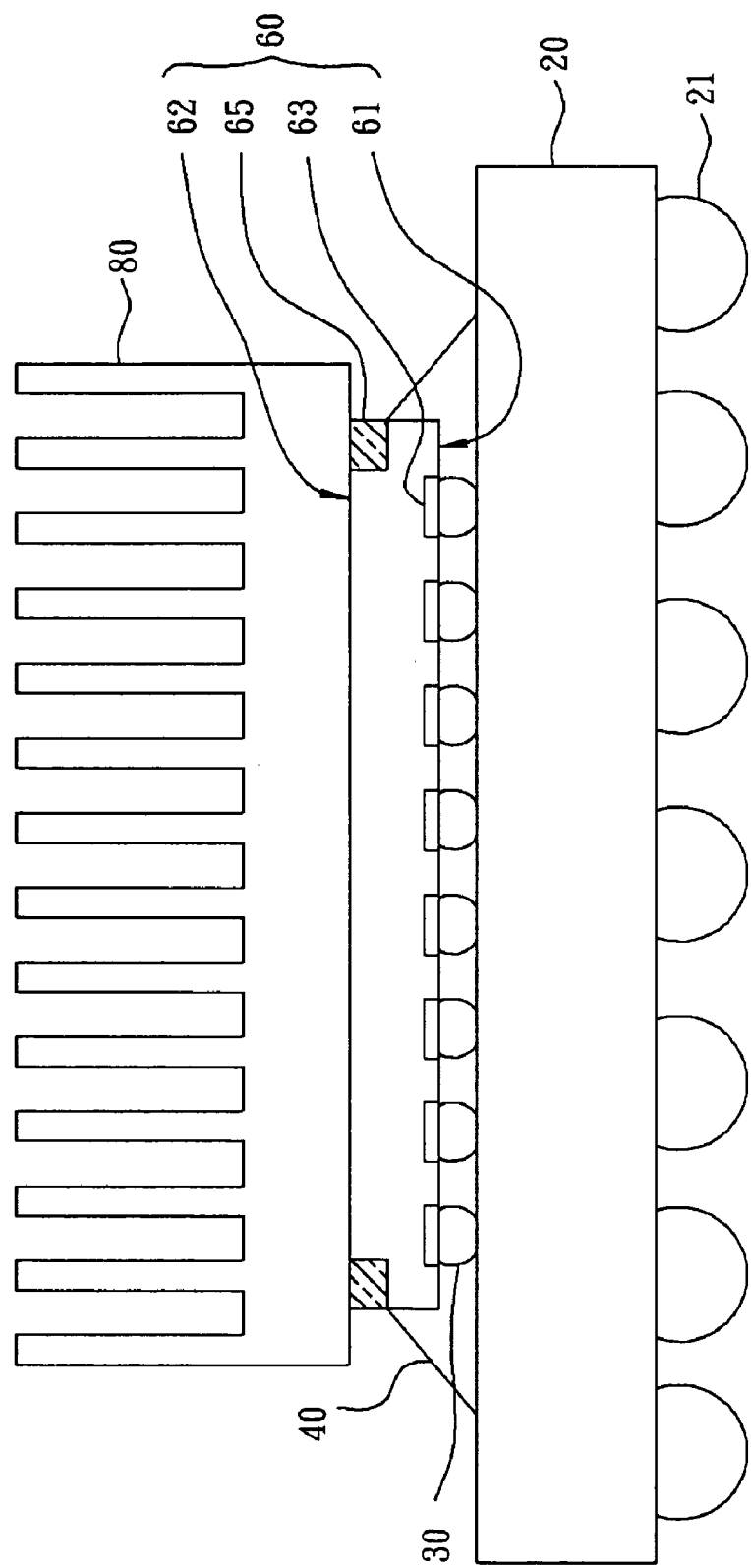

As shown in FIG. 5d, cutting the wafer 70 to separate the substrate 71 and the elastic elements 65 to be each chip 60. The chip 60 with elastic element 65 is formed. As shown in FIG. 5e, flip-chip packaging the chip 60 to form a chip package. The chip 60 is packaged on the chip carrier 20, and the chip 60 is electrically connected to the chip carrier 20 by the bumps 30. The insulating material 40 is dispensed into the gap between the chip 60 and the chip carrier 20 to protect the bumps 30, the chip 60 and the chip carrier 20. Then a flip-chip package is formed and the second surface 62 of the chip 60 and the elastic element 65 are exposed. The fabricating method may also be applied to form the chip package as FIG. 4. The second surface 62 of the chip 60 and the elastic element 65 are also exposed to maintain the thermal dissipating efficiency and protect the edge of the chip. The chip 60 is bonded with the chip carrier 20 by packaging processes to form the chip package and expose the second surface 62 of the chip 60 and the elastic element 65. A thermal dissipating element 80 may be further disposed on the second surface 62 to enhance the thermal dissipating efficiency of the chip 60. The chip carrier 20 may be a packaging substrate, a lead frame or a module circuit board. In addition, the chip carrier 20 may be another chip to form a multi chip package.

In summary, the present invention achieves excellent functions and results as follows:

1. The second surface is exposed to maintain the thermal dissipating efficiency and a thermal dissipating element may be further disposed on the second surface to enhance the thermal dissipating efficiency of the chip;

2. The elastic element protects the edge of the exposed second surface, absorbs the collisions to the edge and reduces the damage possibility to the chip 3. The fabricating cost is further reduced because of the reduction of damage possibility; and 4. The chip and the chip package will not occupy the space of the chip carrier and leads to an elastic design, more compact structure and scale size.

Although the present invention has been descried with reference to specific embodiments, this description is not meant to be construed in a pivoting sense. Various modifications of the disclosed embodiments, as well as alterative embodiments, will be apparent to persons skilled in the art. It is, therefore, contemplated that the appended claims will cover all modifications that fall within the true scope of the present invention.

What is claimed is:

1. A chip, comprising:
   a first surface located at one side of the chip, wherein the first surface is an active surface;
   a second surface located at the other side of the chip, wherein the edge of the second surface has at least one trench, and the second surface is a non-active surface;
   a plurality of pads disposed on the first surface; and
   at least one elastic element disposed in the trench of the edge of the second surface.

2. The chip according to claim 1, wherein the elastic element is made of benzo-cyclobutene or polyimide.

3. The chip according to claim 1, wherein the elastic element does not protrude over the second surface.

4. The chip according to claim 1, wherein the second surface is a back surface.

5. The chip according to claim 1, wherein the elastic element is in a ring shape surrounding the edge of the second surface.

6. The chip according to claim 1, wherein the chip has a plurality of elastic elements respectively disposed at the corners of the second surface.

7. A chip package, comprising:
   a chip carrier;
   a chip disposed on the chip carrier and having a first surface, a second surface, a plurality of pads disposed on the first surface, and at least one elastic element, wherein the edge of the second surface has at least one trench and the at least one elastic element is disposed on the at least one trench of the edge of the second surface, wherein the first surface is an active surface, and the second surface is a non-active surface;
   a plurality of conductors electrically connected to the pads and the chip carrier, respectively; and
   an insulating material covering the conductors, a portion of the chip carrier and a portion of the chip, wherein the second surface and the elastic element protrude above the insulating material.

8. The chip package according to claim 7, wherein the conductors are bumps respectively disposed on one of the pads and are electrically connected to the chip carrier.

9. The chip package according to claim 7, wherein the conductors are bonding wires respectively electrically connecting the pads and the chip carrier.

10. The chip package according to claim 7, wherein the elastic element is made of benzo-cyclobutene or polyimide.

11. The chip package according to claim 7, wherein the elastic element does not protrude above the second surface.

12. The chip package according to claim 7, wherein the elastic element is in a ring-shape surrounding the edge of the second surface.

13. The chip package according to claim 7, wherein the chip has a plurality of elastic elements respectively disposed at the corners of the second surface.

14. The chip package according to claim 7, further comprising a thermal dissipating element directly in contact with the second surface.

15. The chip package according to claim 7, wherein the chip carrier is a packaging substrate, a lead frame, a module circuit board or another chip.

16. A fabricating method of a chip with elastic element, comprising the steps of:
   providing a wafer having a plurality of chips, the chip having a first surface, a second surface and a plurality of pads disposed on the first surface;
   trenching the edge of the second surface of the chip to form at least one trench;
   dispensing an elastic material into the trench; and
   cutting the wafer to separate the chips.

17. The fabricating method according to claim 16, further comprising a step of planarizing the elastic material so as to not protrude over the second surface.

18. The fabricating method according to claim 16, wherein the step of dispensing an elastic material into the trench further comprises the steps of dispensing an elastic material on the whole second surface and removing the elastic material outside of the trench by photolithography.

19. The fabricating method according to claim 16, wherein the step of trenching the edge of the second surface of the chip to form at least one trench further comprises the steps of dispensing a photoresist layer on the second surface, forming at least one trench by photolithography, and removing the photoresist layer.

20. The fabricating method according to claim 16, wherein the at least one trench surrounds the edge of the second surface.

* * * * *